US006668361B2

(12) United States Patent
Bailis et al.

(10) Patent No.: US 6,668,361 B2
(45) Date of Patent: Dec. 23, 2003

(54) METHOD AND SYSTEM FOR USE OF A FIELD PROGRAMMABLE FUNCTION WITHIN A CHIP TO ENABLE CONFIGURABLE I/O SIGNAL TIMING CHARACTERISTICS

(75) Inventors: Robert Thomas Bailis, Cary, NC (US); Charles Edward Kuhlmann, Raleigh, NC (US); Charles Steven Lingafelt, Durham, NC (US); Ann Marie Rincon, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 10/015,920

(22) Filed: Dec. 10, 2001

(65) Prior Publication Data

US 2003/0110453 A1 Jun. 12, 2003

(51) Int. Cl.⁷ .............................................. G06F 17/50
(52) U.S. Cl. ................................ 716/4; 716/5; 716/16; 716/17
(58) Field of Search ................................. 716/16–17, 1, 716/4–5; 326/38–41; 714/725

(56) References Cited

U.S. PATENT DOCUMENTS

| 5,469,003 A | * 11/1995 | Kean ............................ 326/39 |
| 5,477,475 A | * 12/1995 | Sample et al. ................. 716/16 |
| 5,603,043 A | * 2/1997 | Taylor et al. ................... 712/1 |
| 5,812,414 A | * 9/1998 | Butts et al. .................... 716/16 |
| 6,081,473 A | * 6/2000 | Agrawal et al. ............... 326/38 |
| 6,134,173 A | 10/2000 | Cliff et al. ................. 265/230.3 |
| 6,173,419 B1 | 1/2001 | Barnett .......................... 714/28 |
| 6,178,541 B1 | 1/2001 | Joly et al. ..................... 716/17 |
| 6,181,159 B1 | 1/2001 | Rangasayee .................. 326/39 |
| 6,182,206 B1 | 1/2001 | Baxter .......................... 712/43 |
| 6,182,247 B1 | 1/2001 | Hermann et al. ............. 714/39 |
| 6,191,614 B1 | 2/2001 | Schultz et al. ................ 326/41 |
| 6,209,118 B1 | 3/2001 | LaBerge ........................ 716/1 |

(List continued on next page.)

OTHER PUBLICATIONS

C. E. Kuhlmann et al., U.S. pending patent application Ser. No. 10/016,346 (docket RPS920010125US1), "Field Programmable Network Processor and Method for Customizing a Network Processor".

(List continued on next page.)

Primary Examiner—Leigh M. Garbowski
Assistant Examiner—Paul Dinh
(74) Attorney, Agent, or Firm—Sawyer Law Group

(57) ABSTRACT

An application specific integrated circuit (ASIC) is disclosed. The ASIC includes a standard cell, the standard cell including a plurality of logic functions. The ASIC also includes an input/output (I/O) configuration function coupled to at least a portion of the logic functions. The ASIC further includes a field programmable gate array (FPGA) function coupled to the I/O configuration function. The FPGA function controls the I/O configuration function based upon a configuration file. A system in accordance with the present invention reduces the cost and time associated with the timing analysis activities during development. An FPGA function within the ASIC is utilized to control the I/O characteristics such as delay, termination and/or slew rate for the I/O pin mapping. Different I/O configurations will be provided by the FPGA function depending on the environment the ASIC is used in. By providing an ASIC that is adaptable to different timing criteria through FPGA programming, the timing analysis performed by the user of the ASIC will be substantially reduced, resulting in a reduction of the development cycle.

7 Claims, 7 Drawing Sheets

U.S. PATENT DOCUMENTS

| | | | |
|---|---|---|---|
| 6,211,697 B1 | 4/2001 | Lien et al. | 326/41 |
| 6,219,819 B1 | 4/2001 | Vashi et al. | 716/3 |
| 6,219,833 B1 | 4/2001 | Solomon et al. | 717/5 |
| 6,223,148 B1 | 4/2001 | Stewart et al. | 703/25 |
| 6,223,313 B1 | 4/2001 | How et al. | 714/724 |
| 6,226,776 B1 | 5/2001 | Panchul et al. | 716/3 |
| 6,230,119 B1 | 5/2001 | Mitchell | 703/27 |
| 6,237,021 B1 | 5/2001 | Drummond | 709/201 |
| 6,247,147 B1 | 6/2001 | Beenstra et al. | 714/39 |
| 6,249,143 B1 | 6/2001 | Zaveri et al. | 326/40 |
| 6,252,422 B1 | 6/2001 | Patel et al. | 326/80 |
| 6,253,267 B1 | 6/2001 | Kim et al. | 710/103 |
| 6,256,296 B1 | 7/2001 | Ruziak et al. | 370/277 |
| 6,260,087 B1 | 7/2001 | Chang | 710/100 |
| 6,260,182 B1 | 7/2001 | Mohan et al. | 716/12 |
| 6,260,185 B1 | 7/2001 | Sasaki et al. | 716/18 |

OTHER PUBLICATIONS

R. T. Bailis et al., U.S. pending patent application Ser. No. 10/016,772 (docket RPS920010126US1), "Method and System for Use of an Embedded Field Programmable Gate Array Interconnect for Flexible I/O Connectivity".

R. T. Bailis et al., U.S. pending patent application Ser. No. 10/016,449 (docket RPS920010127US1), "Method and System for Use of a Field Programmable Gate Array Function within an Application Specific Integrated Circuit (ASIC) to Enable Creation of a Debugger Client within the ASIC".

R. T. Bailis et al., U.S. pending patent application Ser. No. 10/016,448 (docket RPS920010128US1), "Method and System for Use of a Field Programmable Function within an Application Specific Integrated Circuit (ASIC) to Access Internal Signals for External Observation and Control".

R. T. Bailis et al. U.S. pending patent application Ser. No. 10/015,922 (docket RPS920010129US1), "Method and System for Use of a Field Programmable Interconnect within an ASIC for Configuring the ASIC".

R. T. Bailis et al., U.S. pending patent application Ser. No. 10/015,923 (docket RPS920010131US1), "Method and System for Use of a Field Programmable Function within a Standard Cell Chip for Repair of Logic Circuits".

R. T. Bailis et al., U.S. pending patent application Ser. No. 10/015,921 (docket RPS920010132US1), "Method and System for Use of a Field Programmable Gate Array (FPGA) Cell for Controlling Access to On–Chip Functions of a System on a Chip (SOC) Integrated Circuit".

\* cited by examiner

METHOD AND SYSTEM FOR USE OF A FIELD PROGRAMMABLE FUNCTION WITHIN A CHIP TO ENABLE CONFIGURABLE I/O SIGNAL TIMING CHARACTERISTICS

CROSS-RELATED APPLICATIONS

The present application is related to the following listed seven applications: Ser. No. 10/016,346 entitled "Field Programmable Network Processor and Method for Customizing a Network Processor;" Ser. No. 10/016,772 entitled "Method and System for Use of an Embedded Field Programmable Gate Array Interconnect for Flexible I/O Connectivity;" Ser. No. 10/016,449 entitled "Method and System for Use of a Field Programmable Gate Array (FPGA) Function Within an Application Specific Integrated Circuit (ASIC) to Enable Creation of a Debugger Client Within the ASIC;" Ser. No. 10/016,448 entitled "Method and System for Use of a Field Programmable Function Within an Application Specific Integrated Circuit (ASIC) To Access Internal Signals for External Observation and Control;" Ser. No. 10/015,992 entitled "Method and System for Use of a Field Programmable Interconnect Within an ASIC for Configuring the ASIC;" Ser. No. 10/015,923 entitled "Method and System for Use of a Field Programmable Function Within a Standard Cell Chip for Repair of Logic Circuits;" and Ser. No. 10/015,921 entitled "Method and System for Use of a Field Programmable Gate Array 9FPGA) Cell for Controlling Access to On-Chip Functions of a System on a Chip (S)C) Integrated Circuit;" assigned to the assignee of the present application, and filed on the same date.

FIELD OF THE INVENTION

The present invention relates generally to application specific integrated circuits (ASICs) and specifically to configuring I/O signal timing characteristics of such a circuit.

BACKGROUND OF THE INVENTION

The high clock speeds of today's application specific integrated circuits (ASICs) demand that critical timing to external devices must be met. During the development cycle, great effort is spent to complete timing analysis and design a printed circuit board that will meet all of the timing specifications. If the same ASIC is used in a different design, the timing analysis effort needs to be reanalyzed. The timing constraints make the printed board layout more difficult, resulting in a longer development cycle.

Time to market is very critical in the product life cycle. Often the design engineer is challenged by a complex design and short development schedules. It would be very attractive to be able to design with high speed ASICs without the intense timing analysis. In some cases, there are no resources (engineers, equipment, tools, knowledge, and time) to complete successful timing analysis. Currently, timing and EMC issues are solved by a combination of delay lines, PCB layout, selection of proper vendor for external devices, ferrite beads and enclosure requirements. These techniques are time consuming and expensive. Sometimes there is not enough resources and/or time to complete a successful design.

Accordingly, what is needed is a system and method to overcome the above-identified problems. The present invention addresses such a need.

SUMMARY OF THE INVENTION

An application specific integrated circuit (ASIC) is disclosed. The ASIC includes a standard cell, the standard cell including a plurality of logic functions. The ASIC also includes an input/output (I/O) configuration function coupled to at least a portion of the logic functions. The ASIC further includes a field programmable gate array (FPGA) function coupled to the I/O configuration function. The FPGA function controls the I/O configuration function based upon a configuration file.

A system in accordance with the present invention reduces the cost and time associated with the timing analysis activities during development. An FPGA function within the ASIC is utilized to control the I/O characteristics such as delay, pin mapping, termination and/or slew rate for the I/O. Different I/O configurations will be provided by the FPGA function depending on the environment the ASIC is used in. By providing an ASIC that is adaptable to different timing criteria through FPGA programming, the timing analysis performed by the user of the ASIC will be substantially reduced, resulting in a reduction of the development cycle.

DETAILED DESCRIPTION

The present invention relates generally to application specific integrated circuits (ASICs) and specifically to configuring I/O signal timing characteristics of such a circuit. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
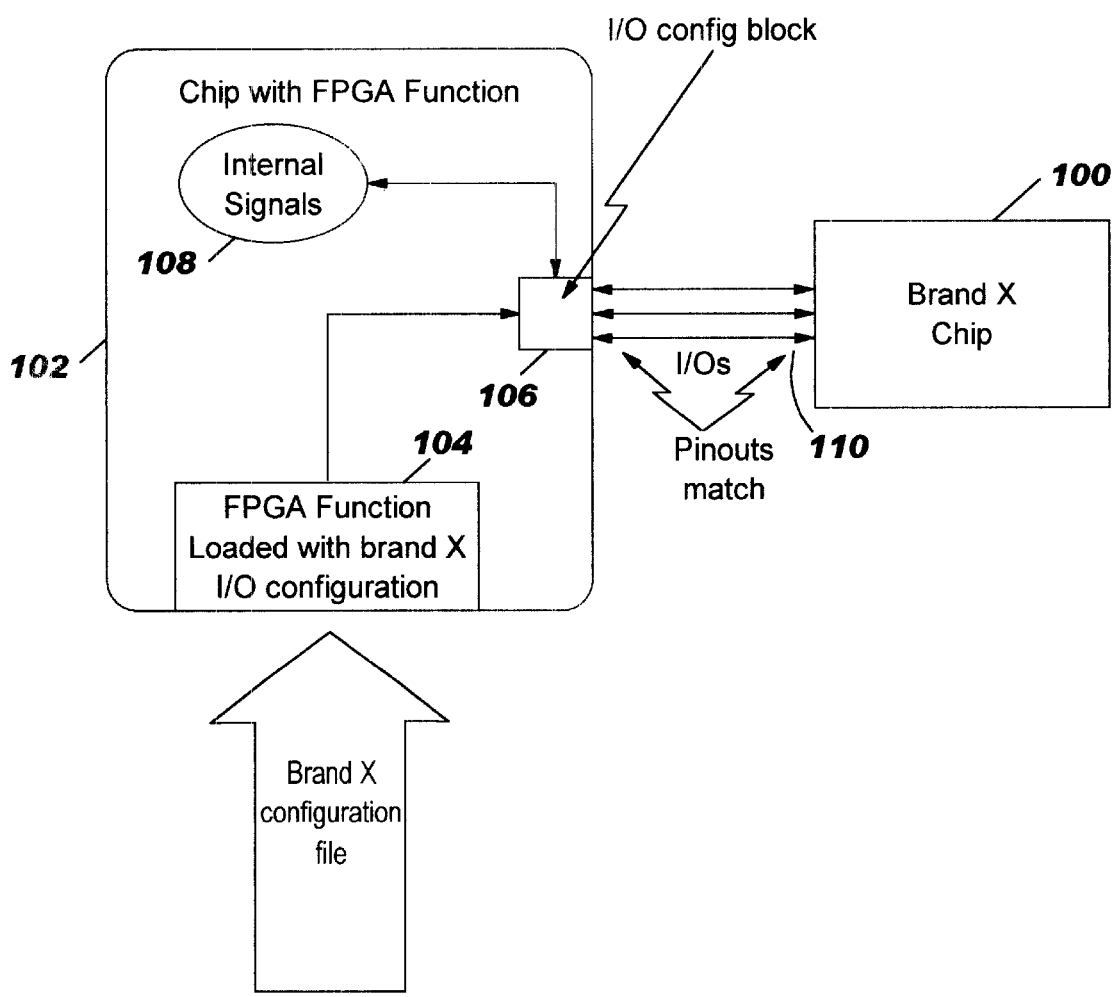
FIG. 1 is a block diagram illustrating a particular chip coupled to an ASIC.

FIG. 1 is a block diagram illustrating a particular chip 100 coupled to an ASIC 102. The ASIC 102 includes an FPGA function 104. The FPGA function 104 is coupled to an I/O configuration block 106. The I/O configuration block 106 is also coupled to internal signals 108. As is seen, the I/O signals 110 are coupled from the chip 100 to an I/O configuration block 106 of the ASIC 102. The FPGA function 104 is loaded with a configuration that matches the configuration of the chip 100 to ensure proper timing between I/O channel 110 and/or pinouts. Accordingly, a configuration file is loaded into the FPGA function 104 that then communicates that configuration file to the I/O configuration block 106. In so doing, the I/Os pinouts match to minimize timing problems. To further describe this matching function refer now to FIG. 1A.

Figure 1A:
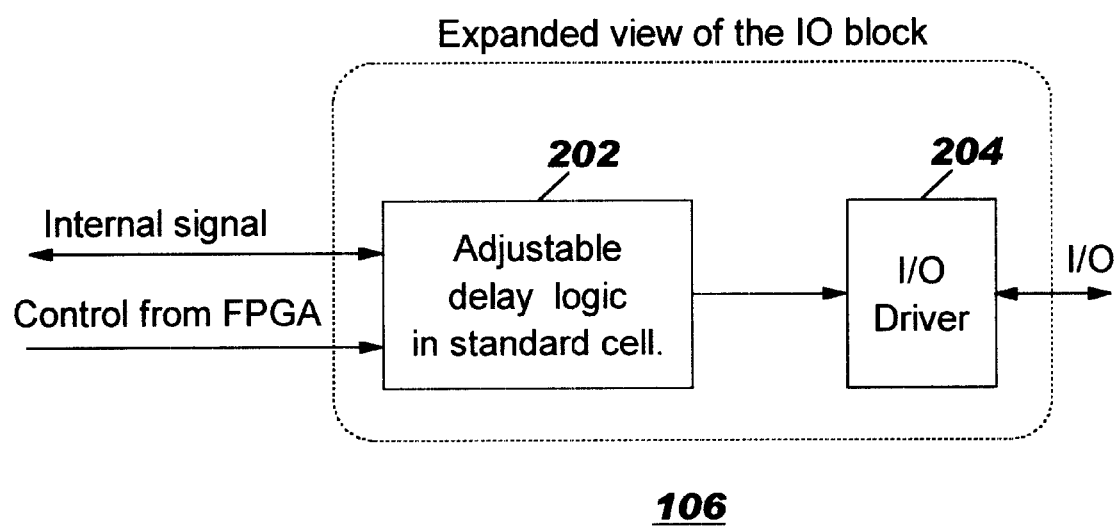
FIG. 1A is an expanded block diagram of the I/O configuration block.

FIG. 1A is an expanded block diagram of the I/O configuration block 106. I/O configuration block 106 includes an adjustable delay logic 202 and an I/O driver 204 coupled to the adjustable delay logic 202. The adjustable delay logic 202 is in a standard cell array. The configuration file which is loaded into the FPGA function 104 (FIG. 1) allows the FPGA to control the adjustable delay logic 202 to provide the appropriate timing to the I/O driver 204.

Having a ASIC 102 that can change its I/O timing characteristics and pinout can eliminate design issues and can create opportunities for applications that previously may not have existed. A major advantage is that the ASIC can adapt any I/O pin out to match the attached chips. This increases performance and greatly reduces the PCB design effort.

Figure 2:
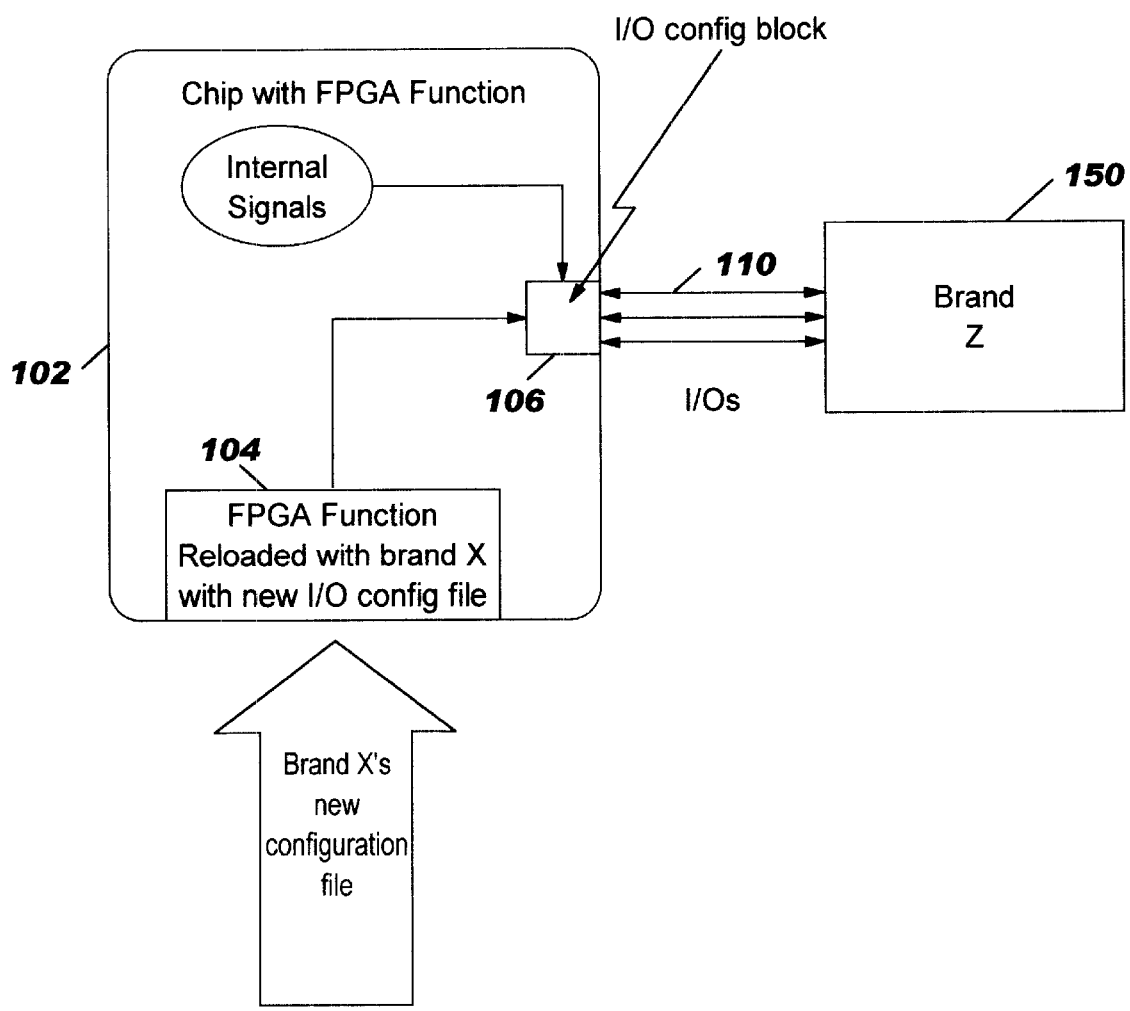
FIG. 2 illustrates the ASIC being coupled to a chip with different timing than the chip in FIG. 1.

FIG. 2 illustrates the ASIC 102 being coupled to a chip 150 with different timing than the chip in FIG. 1. If the vendor of the external device that the ASIC 102 is attached to changes its timing specification, the new timing can be met by simply adjusting the I/O timing configuration provided by the FPGA function 104. Accordingly, choosing a new vendor and/or re-spin of the PCB is avoided.

In a preferred embodiment, the manufacturer of the ASIC 102 will know what applications and external devices that it will connect to. Testing will be done by the manufacturer of ASIC 102 to determine the correct I/O characteristics on a suit of different applications and various external devices that ASIC 102 is intended for. A set of different configurations will be available to the customer. The customer will choose an I/O configuration depending on how the ASIC 102 is used in the application. Only minimal timing analysis need to be completed to ensure a successful design. The FPGA function 104 controls the I/O configuration block 106. The pin layout of the ASIC 102 and chip 100 will be considered. The ASIC 102 pin layout will be remapped to line up with the chip 100 pin out. This will reduce the length of the PCB traces and greatly reduce the effort of PCB layout. It can also reduce the crosstalk between signals by having a straight path between the ASIC 102 and chip 100.

Once the configuration is set the system can be tuned to provide optimal performance. Two tuning techniques are described in detail hereinbelow.

Logic Analyzer Tuning

Figure 3:
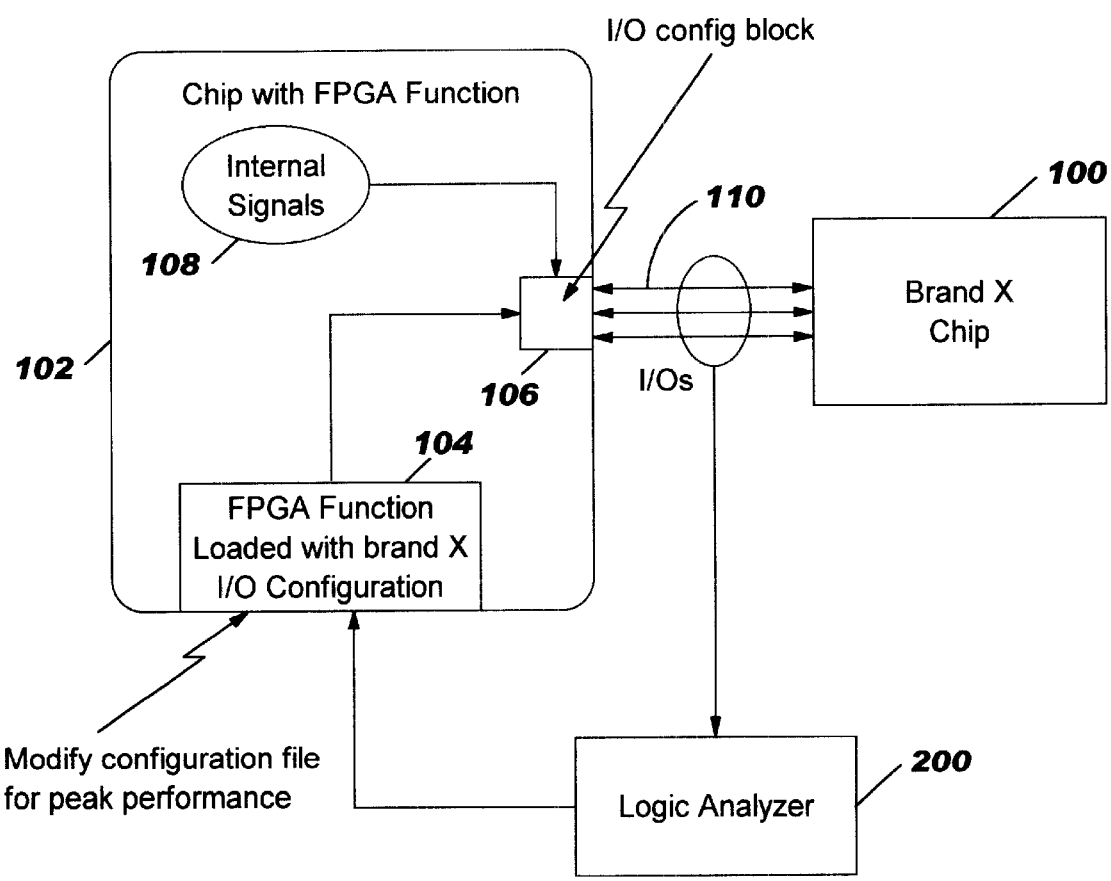
FIG. 3 illustrates the use of a logic analyzer to collect data and modify the configuration file of the FPGA function.
Figure 3A:
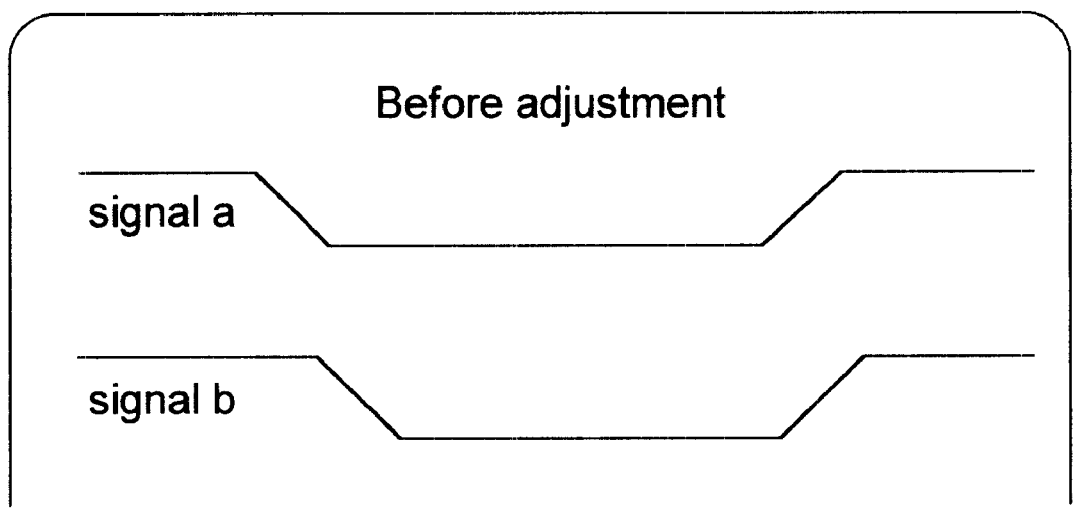
FIG. 3A illustrates two signals (signal a and signal b) before an adjustment.
Figure 3B:
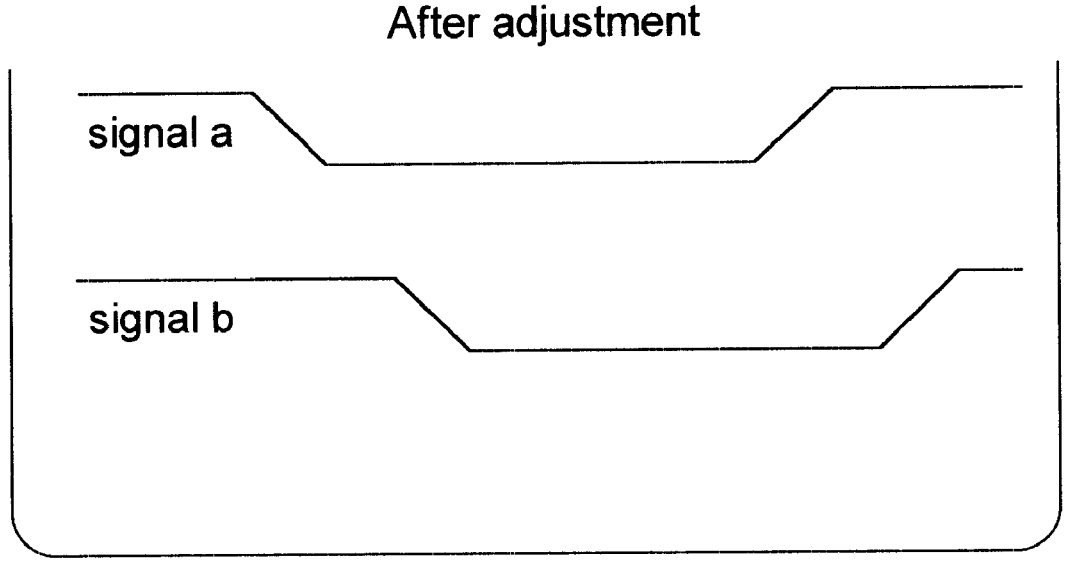
FIG. 3B illustrates signal b delayed to adjust timing.

FIG. 3 illustrates the use of a logic analyzer to collect data and modify the configuration file of the FPGA function. As is seen in FIG. 3, a logic analyzer 200 monitors the I/O signals 110 to ensure that the signals between the signals 110 are within its timing specifications. FIG. 3A illustrates two signals (signal a and signal b) before an adjustment. As is seen, signal a and signal b can have timing problems because they rise and fall in a corresponding fashion. The logic analyzer can modify the I/O configuration file in accordance with known programming techniques and therefore the timing performance can be optimized. In this embodiment signal b is delayed as shown in FIG. 3B to correct timing problems. In this embodiment signal b is delayed a shown in FIG. 3B to correct timing problems.

EMC Analyzer Tuning

Figure 4:
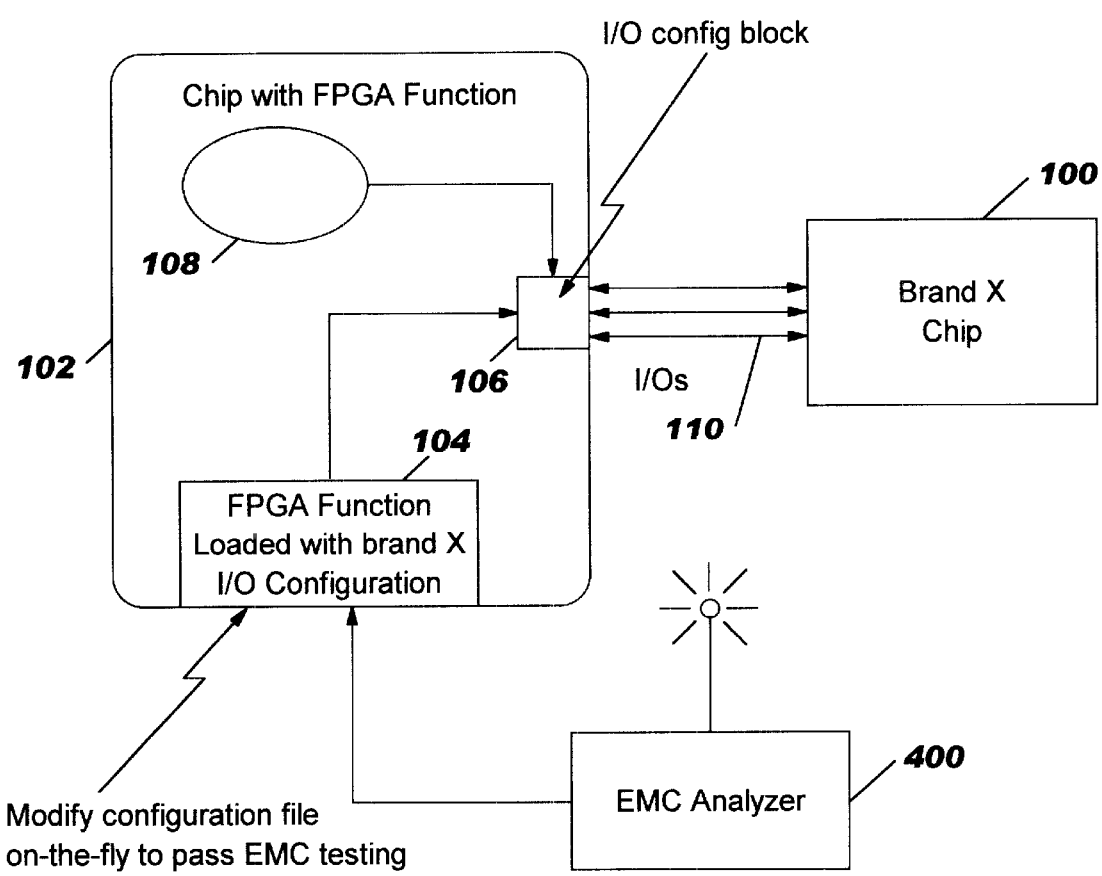
FIG. 4 illustrates the use of an electromagnetic compatibility analyzer that can be used to obtain information to be used to modify the I/O configuration to ensure that there is EMC compliance.

FIG. 4 illustrates the use of an electromagnetic compatibility (EMC) analyzer 400 that can be used similarly to obtain information to be used to modify the I/O configuration to ensure that there is EMC compliance. The I/O timing characteristics can be changed by modifying the I/O configuration file in accordance with known programming techniques while the product is in an EMC chamber. This can save a vast amount of time not having to re-spin a PCB in order to meet EMC requirements. Accordingly, the I/O timing characteristics can be tuned to give the optimal performance to overcome process variations of ASICs and external devices.

Although the above-identified two tuning techniques are disclosed, numerous other tuning techniques could be utilized and they would be within the spirit and scope of the present invention.

Conclusion

A system in accordance with the present invention reduces the cost and time associated with the timing analysis activities during development. An FPGA cell function within the ASIC is utilized to control the I/O characteristics such as delay, termination and/or slew rate for the I/O. Different I/O configurations will be provided by the FPGA function depending on the environment the ASIC is used in. By providing an ASIC that is adaptable to different timing criteria through FPGA programming, the timing analysis performed by the user of the ASIC will be substantially reduced, resulting in a reduction of the development cycle.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An application specific integrated circuit (ASIC) comprising:

a standard cell array, the standard cell array comprising a plurality of logic functions;

an input/output (I/O) configuration block coupled to at least a portion of the logic functions; and a field programmable gate array (FPGA) function coupled to the I/O configuration block, wherein the FPGA function controls the I/O configuration block based upon configuration information provided thereto, wherein the configuration information comprises a configuration file, wherein the I/O configuration block is adapted to be coupled to signals of an external chip and the configuration file provides timing information to the I/O configuration block to ensure appropriate timing characteristics between the external chip and the ASIC, wherein the configuration information is tuned utilizing an electro-magnetic compatibility (EMC) analyzer to monitor magnetic compatibility of the pinouts of the external chip and the ASIC and to modify the configuration file.

2. The ASIC of claim 1 wherein the I/O configuration block comprises:

adjustable delay logic for receiving the configuration file from the FPGA function; and an I/O driver coupled to the adjustable delay logic for receiving timing information from the adjustable delay logic to ensure appropriate timing characteristics between the external chip and the ASIC.

3. The ASIC of claim 1 wherein the configuration file is tuned to provide optimal performance of the ASIC.

4. The ASIC of claim 1 wherein the configuration file is tuned utilizing a logic analyzer to monitor the signals for timing violations and to modify the configuration file.

5. An ASIC (ASIC) comprising:

a standard cell array, the standard cell array comprising a plurality of logic functions;

a field programmable gate array (FPGA) function; and an input/output (I/O) configuration block coupled to at least a portion of the logic functions and the FPGA function, wherein the FPGA function controls the I/O configuration block based upon a configuration file provided thereto, wherein the I/O configuration block comprises adjustable delay logic for receiving the configuration file from the FPGA function and comprises an I/O driver coupled to the adjustable delay logic and coupled to signals of an external chip, wherein the configuration file provides timing information to the I/O driver to ensure appropriate timing characteristics between the external chip and the ASIC, wherein the configuration information is tuned utilizing an electromagnetic compatibility (EMC) analyzer to monitor magnetic compatibility of the pinouts of the external chip and the ASIC and to modify the configuration file.

6. The ASIC of claim 5 wherein the configuration file is tuned utilizing a logic analyzer to monitor the signals for timing violations and to modify the configuration file.

7. The ASIC of claim 5 wherein the configuration file is tuned utilizing a logic analyzer to monitor the signals for timing violations and to modify the configuration file.

* * * * *